United States Patent [19]

Rossman

[11] Patent Number: 5,027,374
[45] Date of Patent: Jun. 25, 1991

[54] BIT SERIAL VITERBI DECODER ADD/COMPARE/SELECT ARRAY

[75] Inventor: Mark W. Rossman, Austin, Tex.

[73] Assignee: Motorola, Inc., Schaumburg, Ill.

[21] Appl. No.: 498,800

[22] Filed: Mar. 26, 1990

[51] Int. Cl.⁵ .............................................. G06F 11/00
[52] U.S. Cl. ........................................ 375/94; 371/43
[58] Field of Search ....................... 375/17, 39, 34, 75, 375/94; 371/43; 329/311; 341/50, 51, 81, 107

[56] References Cited

U.S. PATENT DOCUMENTS

| | | | |
|---|---|---|---|
| 4,500,994 | 2/1985 | McCallister et al. | 371/43 |
| 4,606,027 | 8/1986 | Otani | 371/43 |
| 4,763,328 | 8/1988 | Shimoda et al. | 371/43 |
| 4,860,310 | 8/1989 | Lamnabhi et al. | 371/43 |
| 4,905,317 | 2/1990 | Suzuki et al. | 341/51 |
| 4,979,175 | 12/1990 | Porter | 371/43 |

OTHER PUBLICATIONS

"Parallel Viterbi Algorithm Implementation: Breaking the ACS-Bottleneck", Fettweis et al. IEEE Transactions on Communications, pp. 785–789, vol. 37, No. 8, Aug. 1989.
"VLSI Structures for Viterbi Receivers: Part 1–General Theory and Applications", Gulak et al. IEEE Journal On Selected Areas in Communications, pp. 142–154, vol. SAC-4, No. 1, Jan. 19.
"VLSI Structures for Viterbi Receivers: Part II–Encoded MSK Modulation", Gulak et al. IEEE Journal On Selected Areas in Communications, pp. 155–159, vol. SAC-4, No. 1, Jan. 1986.
"Locally Connected VLSI Architectures for the Viterbi Algorithm", Gulak et al. IEEE Journal on Selected Areas in Communications, pp. 527–537, vol. 6, No. 3, Apr. 1988.
"Implementation of a Viterbi Processor for a Digital Communications System with a Time-Dispersive Channel", Frenette et al., IEEE Journal on Selected Areas in Communications, pp. 160–167, vol. SAC-4, No. 1, Jan. 1986.
"Algorithms and Architectures for Concurrent Viterbi Decoding", Lin et al., IEEE International Conference on Communications, pp. 836–840, Jun. 1989.
"In-Place Updating of Path Metrics in Viterbi Decoders", Biver et al., IEEE Journal of Solid-State Circuits, pp. 1158–1160, vol. 24, No. 4, Aug. 1989.

Primary Examiner—Benedict V. Safourek
Attorney, Agent, or Firm—Robert L. King

[57] ABSTRACT

A circuit array comprises a plurality of add/carry/-select (ACS) circuits which operate in parallel to perform an operation required to implement convolutional coding for error correction in digital communications system. The ACS circuits are commonly used in Viterbi decoders. Each ACS circuit of the array operates in serial form with single bit-wide adders which function to implement addition of branch metrics, comparison of accumulated metrics, selection of the smallest accumulated metric for each state in a state machine and maintaining a path history to each state. As a result, interconnect between the ACS circuits is minimized.

5 Claims, 2 Drawing Sheets

BIT SERIAL VITERBI DECODER ADD/COMPARE/SELECT ARRAY

TECHNICAL FIELD

This invention relates to digital communications, and more particularly, to error correction techniques.

BACKGROUND OF THE INVENTION

A primary goal in digital communications is the transmission of data in error-free form. During transmission, the data is subjected to noise which may cause errors in the received data. To improve the reliability of data transmission, one of a variety of possible error correction techniques is commonly utilized. A known error correction technique is convolutional coding. This technique provides an effective error correction capability but requires sophisticated decoding techniques.

An optimal solution for decoding convolutional codes is credited to Andrew Viterbi and is well known as the Viterbi algorithm (VA). The Viterbi algorithm is a recursive solution to the problem of estimating the state sequence of a discrete-time finite-state Markov process observed in memory-less noise. Viterbi decoding is not restricted to convolutional codes, but can be applied to other sequence estimation problems such as channel equalizers. Decoding of convolutional codes requires making probabilistic decisions based on a sequence of received bits rather than on an individual bit-by-bit basis. The basic operation of the Viterbi decoder is to select the path through a trellis, in the presence of noise, that represents the most likely sequence that was generated by a convolutional encoder. The Viterbi algorithm makes use of the recurrent properties of convolutional codes to provide an efficient solution to this problem. At each symbol period the algorithm generates a metric, a measure of probability, for each branch. The best path to each state is then determined by examining the accumulated metrics from all paths entering the state and selecting the one with the best metric. The other path or paths are discarded. Therefore, paths with errors will accumulate lower metrics and therefore be discarded leaving only the path that represents the sequence which was most likely generated by the encoder. To implement the Viterbi algorithm, a plurality of add/compare/select (ACS) operations must be performed to calculate the best path to each state. In today's central processing architectures which implement the Viterbi algorithm, sequential processing is utilized to perform the ACS operations. In a CPU approach, a plurality of sequential memory fetches, addition, storage and comparison operations must be executed. The sequential operation limits data throughput due to the high number of instructions needed per symbol or data bit. An alternative to this problem is the use of full or semi-parallel word-wide processing architectures. For example, a hardware circuit is implemented for each required state to perform the ACS operations in parallel. Because branch and path metrics are represented as multibit values, each ACS circuit must perform multibit arithmetic calculations. The parallel operation architectures require a large area of silicon to implement due to: (1) a large plurality of elements such as adders, comparators, etc. required for each state to implement word-wide processing; and (2) extensive interconnect resulting from the required use of multi-bit data buses.

SUMMARY OF THE INVENTION

Accordingly, it is an object of the present invention to provide an improved bit serial Viterbi decoder array. Another object of the present invention is to provide an improved method and ACS circuit for implementing the Viterbi decoding function in a digital communications system.

In carrying out the above and other objects of the present invention, there is provided, in one form, a digital communications system having an array of circuit units which each perform an add/compare/select (ACS) function. The array implements a predetermined code trellis diagram in accordance with a predetermined convolutional algorithm. The array comprises a plurality of interconnected circuit units, the plurality being equal in number to a number of states existing in the predetermined code trellis diagram. Each of the circuit units has at least two inputs and an output. All of the units are interconnected by single bit-wide conductors for serially transmitting data between the units and all of the units operate concurrently. Each of the units implement the ACS function for a predetermined state of the code trellis diagram while also maintaining path history.

These and other objects, features, and advantages, will be more clearly understood from the following detailed description taken in conjunction with the accompanying drawings.

DETAILED DESCRIPTION OF THE INVENTION

Figure 1:
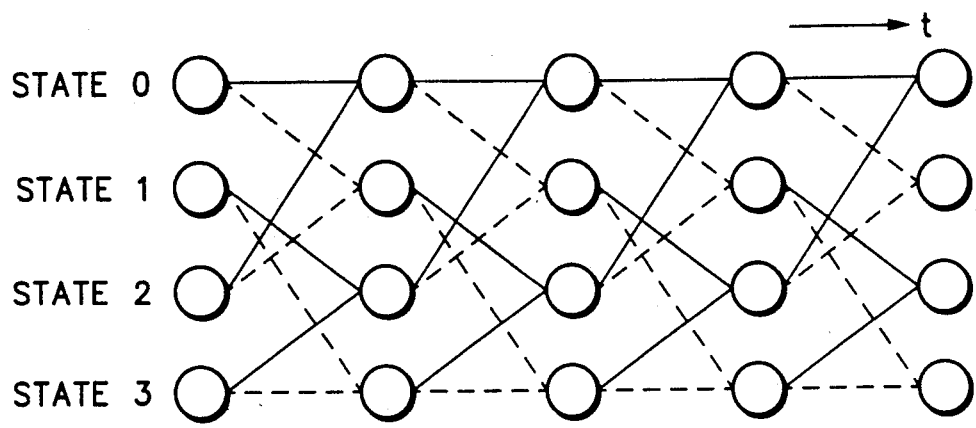
FIG. 1 illustrates in graphical form a known convolutional code trellis diagram of a four-state state machine.

Shown in FIG. 1 is a known convolutional code trellis diagram for a two memory, four-state state machine in a digital communications system. Each state is represented by a circle or state node along a vertical axis and time is represented along a horizontal axis. The trellis diagram of FIG. 1 is but one of many possible diagrams which may exist for a four-state machine. In the illustrated form, a branch indicates a transition from one point in time to a successive point in time. A solid line branch indicates receipt of a symbol bit having a logic zero value, and a dashed line branch indicates receipt of a symbol bit having a logic one value. In this example, from any one of the four states at any particular point in time, a transition to one of two predetermined states is possible depending upon the value of input symbols received. For example, initially if a state machine were in state two, the next point in time would result in a transition to either state zero or state one if the input data is either a logic zero or a logic one, respectively. Each path or branch in the trellis diagram has a unique value or metric which is represented by a multi-bit binary value. Each branch metric is defined as a measure of distance determined by some form of comparison between a received symbol and a corresponding branch in the trellis diagram. The calculation operation of metrics is not relevant to the present invention and will not be further discussed since metric calculation is well documented in existing literature. For purposes of the following discussion, it should be well understood that the term 'symbol' refers to information communicated between an encoder of a transmitter and a decoder of a receiver of a communications system. In contrast, the term 'data' as used herein refers to information which is communicated within an ACS circuit and between ACS circuits of a receiver of a communications system.

The basic operation of a Viterbi algorithm decoder is to select the path through the trellis, in the presence of noise, that represents the highest probable sequence of path history that was generated by a convolutional encoder (not shown). The sequence represents the path taken to implement state transitions over a period of time in response to received data in a digital communications receiver. A Viterbi decoder selects a most likely path by choosing the path through the trellis that accumulates the lowest state metric where state metric is an accumulated measure of "distance" between the received symbol sequence and a particular path in the trellis leading to a given state. The Viterbi decoder makes this decision by calculating a path metric to each state of the trellis and selecting the path with the lowest metric. This operation is repeated for each received symbol. The path metric to each state is calculated by adding each branch metric to its respective previous state metric and selecting the path with the lowest accumulated metric. This operation is commonly referred to in the literature as 'add-compare-select' or ACS. In addition to an ACS unit, the conventional Viterbi algorithm decoder comprises a unit for computing the transition metrics and a survivor memory portion for storing previous path information.

Figure 2:
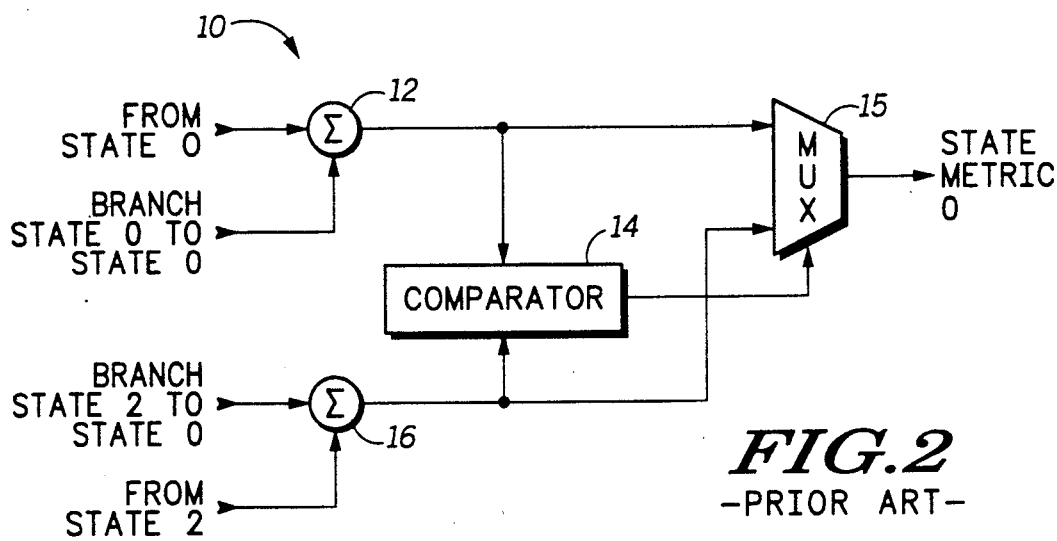
FIG. 2 illustrates in block diagram form a known ACS circuit for state zero of the trellis of FIG. 1.

Shown in FIG. 2 is a conventional ACS unit 10 for implementing the add-compare-select function associated with the Viterbi algorithm. In the illustrated form, ACS unit 10 is functioning for state zero of FIG. 1 during the second time period illustrated. An adder 12 has a first input for receiving a previously accumulated metric from state zero and a second input for receiving the metric value of the branch from state zero to state zero between the first and second state nodes of state zero. An output of adder 12 is connected to a first input of a comparator 14 and to a first input of a multiplexer 15. An adder 16 has a first input for receiving a previously accumulated metric from state two and a second input for receiving the metric value of the branch from state two to state zero between the first state node of state two and the second state node of state zero. An output of adder 16 is connected to a second input of comparator 14 and to a second input of multiplexer 15. An output of comparator 14 is connected to a control input of multiplexer 15. An output of multiplexer 15 provides the new metric for state zero at the second state node of state zero. Adders 12 and 16 perform the respective additions operations and comparator 14 controls multiplexer 15 to output the smallest of the two resulting sums.

The add-compare-select operation performed by unit 10 must be applied to each state for every symbol or data value received. Although the ACS calculation is relatively simple, the number of instructions for a single instruction processor is quite high and limits data throughput. Therefore, a parallel approach to implementing the ACS calculations provides optimum decoding performance.

Figure 3:
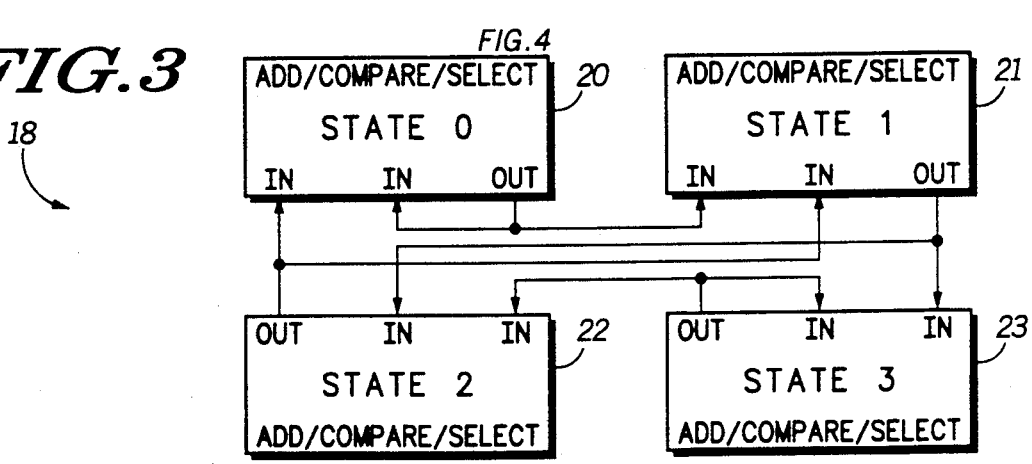
FIG. 3 illustrates in block diagram form a bit serial ACS array in accordance with the present invention.

Shown in FIG. 3 is an ACS array 18 in accordance with the present invention. Array 18 comprises a plurality of ACS circuits 20-23 wherein each ACS circuit corresponds to a predetermined state of a Markov process. Each ACS circuit has illustrated two inputs and an output. ACS circuit 20 has a first input connected to an output of ACS circuit 22 and a second input connected to an output thereof. The output of ACS circuit 20 is connected to a first input of ACS circuit 21. A second input of ACS circuit 21 is connected to the output of ACS circuit 22. An output of ACS circuit 21 is connected to a first input of both ACS circuits 22 and 23. An output of ACS circuit 23 is connected to second inputs of both ACS circuits 22 and 23.

In the illustrated form, ACS array 18 is an array of bit-serial ACS circuits, one for each state of the trellis of FIG. 1. Since an ACS circuit exists for each state, the ACS operation is performed concurrently for all states of the Markov process. However, since a bit-serial interconnect exists and data is transferred in array 18 in series, minimal interconnect exists in array 18. The interconnect of ACS circuits 20-23 is derived from the trellis of FIG. 1 and implements the accumulated state metrics for the illustrated trellis. For example, if the state node for state zero of the second time period in the trellis of FIG. 1 is compared with ACS circuit 20, it can be noted that ACS circuit 20 receives the accumulated metric from the second state (ACS circuit 22) and the accumulated metric from state zero (ACS circuit 20). The direct correlation between array 18 and the FIG. 1 trellis can easily be further verified.

Because the ACS circuits of array 18 are implemented as bit-serial circuits, a relatively small amount of circuitry is required to implement each ACS circuit. Although most implementations of the convolutional codes will require significantly more than four states, the overall circuit area required to implement parallel operation is significantly reduced as opposed to using multi-bit wide ACS circuits. As more states are implemented, the speed savings realized by the present invention is also increased as opposed to the previously known sequential approaches.

Figure 4:
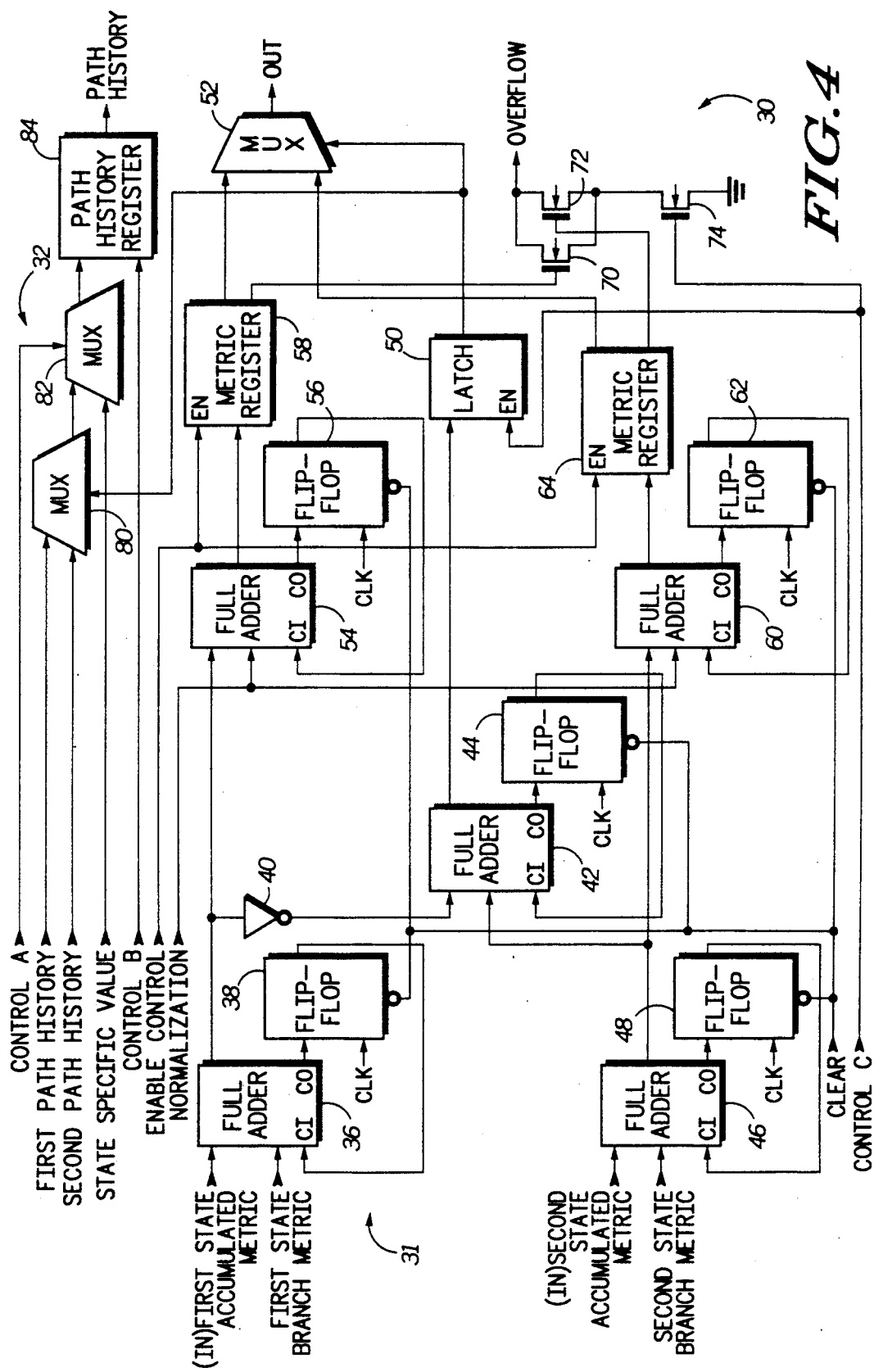
FIG. 4 illustrates in partial schematic form an ACS circuit for use in the array of FIG. 3.

Shown in FIG. 4 is an ACS circuit 30 which may be used for any of the ACS circuits of FIG. 3 such as ACS circuit 20. ACS circuit 30 generally comprises a calculation portion 31 and a path history portion 32. Within calculation portion 31, a one-bit full adder 36 has a first input for receiving a first state accumulated metric value which is equivalent to one of the 'In' terminals shown in FIG. 3. A first state branch metric is connected to a second input of full adder 36. A carry output terminal labeled "CO" is connected to a data input of a flip-flop 38. An output of flip-flop 38 is connected to a carry input terminal labeled "CI" of flip-flop 36. Flip-flop 38 also has a clock input and a reset input. An output of full adder 36 is connected to an input of an inverter 40 which has an output connected to a first input of a one-bit full adder 42. A carry output of full adder 42 is connected to a data input of a flip-flop 44. An output of flip-flop 44 is connected to a carry input of full adder 42. Flip-flop 44 also has a preset input and a clock input. A one-bit full adder 46 has a first input for receiving a second state accumulated metric value which is equivalent to a second of the 'In' terminals shown in FIG. 3. A second state branch metric is connected to a second input of full adder 46. An output of full adder 46 is connected to a second input of full adder 42. A carry output of full adder 46 is connected to a data input of a flip-flop 48. An output of flip-flop 48 is connected to a carry input of full adder 46. A clock signal is connected to a clock input of flip-flop 48. An output of full adder 42 is connected to an input of a latch 50. A control signal C is connected to an enable input of latch 50. An output of latch 50 is connected to a control input of a multiplexer 52. An output of multiplexer 52 is equivalent to the "Out" terminal of any one of the ACS circuits illustrated FIG. 3. The output of full adder 36 is also connected to a first input of a one-bit full adder 54. A Normalization signal is connected to a second input of full adder 54. A carry output of full adder 54 is connected to a data input of a flip-flop 56. An output of flip-flop 56 is connected to a carry input of full adder 54. Flip-flop 56 also has a clock input for receiving a clock signal. An Enable Control signal is connected an enable input labeled "En" of a metric register 58. A first output of metric register 58 is connected to a first input of multiplexer 52. The output of full adder 46 is also connected to a first input of a one-bit full adder 60. The Normalization signal is also connected to a second input of full adder 60. A carry output of full adder 60 is connected to a data input of flip-flop 62. An output of flip-flop 62 is connected to a carry input of full adder 60. A Clear signal is connected to Reset inputs of flip-flops 38, 48, 56 and 62 and to a preset input of flip-flop 44. An output of full adder 60 is connected to a first input of a metric register 64. The Enable control signal is also connected to a second input of metric register 64. Each of metric registers 58, 64 and path history register 84 is a serial-in/serial-out shift register. A first output of metric register 64 is connected to a second input of multiplexer 52. A second output of metric register 58 is connected to a gate of an N-channel transistor 70, and a second output of metric register 64 is connected to a gate of N-channel transistor 72. Transistors 70 and 72 each have a drain connected together for providing an Overflow output signal. Transistors 70 and 72 also each have a source connected together and to a drain of an N-channel transistor 74. A gate of transistor 74 is connected to control signal C and a source of transistor 74 is connected to a ground potential.

In path history portion 32, a multiplexer 80 has a first input connected to a first state path value. A second state path value is connected to a second input of multiplexer 80. An output of multiplexer 80 is connected to a first input of a multiplexer 82. An output of latch 50 is connected to a control input of multiplexer 80. A state specific digital value is connected to a second input of multiplexer 82. A control signal labeled "A" is connected to a control input of multiplexer 82. An output of multiplexer 82 is connected to a first input of a path history register 84. A control signal labeled "B" is connected to a second input of path history register 84. An output of path history register 84 provides a serial history of the decoded symbols leading to one of the states in a trellis diagram which is represented by a given ACS circuit.

In operation, adder 36 with flip-flop 38 and adder 46 with flip-flop 48 function to implement the add portion of the ACS calculation. Adder 42, inverter 40 and flip-flop 44 function to implement the compare portion of the ACS calculation. Multiplexer 52 controlled by latch 50 function to implement the select portion of the ACS calculation. Initially, the Clear signal resets each of flip-flops 38, 48, 56 and 62 to a logic zero output and presets flip-flop 44 to a logic one output. Full adders 36 and 46 each receive the predetermined metric values to be added. In the illustrated form, adder 42 in conjunction with inverter 40 and flip-flop 44 function as a subtraction circuit. As adders 36 and 46 are forming a sum representing the new accumulated metric of each branch, the sums are respectively stored in registers 58 and 64 and coupled to multiplexer 58. A difference is concurrently formed and the sign bit is stored in latch 50. The difference represents a comparison between the accumulated metric from a first state and the accumulated metric from a second state. The value of the sign bit of the comparison is used by multiplexer 52 to determine which path to choose (i.e. which sum to output). ACS circuit 30 operates synchronously in response to a clock signal.

Since metric registers 58 and 64 have a limited storage capacity, normalization is utilized to maintain each of the metric registers within a predetermined range of values. By adding a predetermined Normalization number, which is typically negative, with the output of full adder 36, full adder 54 provides metric register 58 with a normalized value which is within a defined range of values. In the illustrated form, the normalization function is implemented by the addition of a negative constant to each metric register of all ACS circuits such as metric registers 58 and 64. The normalization functions to maintain the metric registers within range.

A saturation or overflow feature is also incorporated into ACS circuit 30 for the purpose of providing an Overflow signal should either of metric registers 58 or 64 begin to overflow in a positive direction. The second output of metric register 58 which is connected to the gate of transistor 70 and the second output of metric register 64 which is connected to the gate of transistor 72 each provide a saturation signal indicating that the respective register is about to overflow. When an overflow is about to occur or occurs, the saturation signal is asserted making one of transistor 70 or 72 conductive. Transistors 70 and 72 function as a logical OR. During a predetermined portion of each calculation cycle, control signal C is asserted making transistor 74 conductive. In the illustrated form, control signal C performs a duplicative function by loading latch 50 and evaluating the overflow status of the metric registers during the same time period. It should be apparent that each function may also be controlled independently. When either of transistors 70 or 72 is conductive and transistor 74 is conductive, the Overflow output is pulled to a logic low level indicating that metric registers have overflowed and need servicing, if desired. Upon assertion of the Overflow signal, a normalization constant is typically distributed to all ACS circuits.

With respect to path history portion 32, control signal A is a control signal from the state machine (not shown). The path history portion 32 is implemented by multiplexers 80 and 82 and path history register 84. The first and second path histories represent the decoded path history of the previous state nodes. Control signal B is used to enable the path history transfer. Control signal A is used to append the ACS circuit's decoded bit(s) to the path history. When control signal A has a logic zero value, the output of multiplexer 80 is passed through to path history register 84. When control signal A has a logic one value, a state specific value which corresponds to the bit(s) causing a transition to the state associated with the particular ACS circuit is outputted by by multiplexer 82 and appended to path history register 84 for subsequent use.

The output of ACS circuit 30 is used to provide a final output within a Viterbi decoder. The final output is derived by either a majority vote function of the oldest bit(s) from each of the ACS circuits 20–23 of array 18 or is derived by using the oldest bit(s) of the ACS circuit of array 18 having the lowest accumulated metric.

It should also be noted that there are several known methods which differ in the way that branch metrics are calculated. Some methods require the maximizing of accumulated metrics by choosing the metric with the largest value. This function may be readily implemented by the present invention by only changing the control logic definition of multiplexers 52 and 82.

By now it should be apparent that there has been provided a bit serial ACS circuit for use in an array to implement the add/compare/select function required by each state in a Viterbi decoder. The array calculates new metrics for all states concurrently and therefore has high efficiency and data throughput. The concurrent parallel operation between ACS units is achieved without parallel interconnect between each ACS circuit in the array. However, a serial single bit-wide ACS circuit is used for each ACS circuit in the array in order to minimize circuit area required to obtain the parallel operation. The higher data throughput in the array which is achieved as a result of the parallel operation allows a slower clock rate to be used as compared with a fully sequential implementation of the add/compare/select functions. With the serial operation within each ACS circuit, the time required to calculate new values for all state metrics is strictly a function of which of metric registers 58 and 64 is the longest. Also, since state metrics are stored within each ACS circuit, no external memory and addressing logic is required. Although the present invention has been discussed in the context of Viterbi decoders, the present invention may be used in any application using convolutional coding for error correction in a digital communications system.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

I claim:

1. In a receiver of a digital communications system, an array of circuit units which each perform an add/compare/select (ACS) function, said array implementing a predetermined code trellis diagram in accordance with a predetermined convolutional code, said array comprising:

a plurality of the circuit units which are interconnected for implementing a predetermined convolutional decoding algorithm, said plurality being equal in number to a number of states existing in the predetermined code trellis diagram, each of said circuit units receiving first and second accumulated state metrics and first and second state branch metrics and providing a predetermined state metric, all of the units being interconnected by single bit-wide conductors for serially transmitting data between the units and all of the units operating concurrently, each of said units comprising:

first and second single bit-wide adder circuits to minimize circuit area for respectively providing first and second sums of predetermined state and branch metrics;

a single bit-wide comparator circuit coupled to the first and second adder circuits for comparing the sums of predetermined state and branch metrics to determine which sum is a state metric with a lowest metric value;

storage means coupled to the first and second bit-wide adder circuits for storing each of the first and second sums; and a selector coupled to the storage means and comparator circuit for outputting one of the stored first and second sums as the predetermined state metric in response to the comparator circuit.

2. The receiver of the digital communications system of claim 1 wherein the storage means of each of the interconnected circuit units comprises two multi-bit registers, each register serially receiving and providing one of the two sums in single bit form.

3. The receiver of the communications system of claim 1 wherein the predetermined convolutional decoding algorithm is Viterbi's algorithm.

4. The receiver of the communication system of claim 2 wherein each circuit unit further comprises:

path history means coupled to the comparator circuit, said path history means receiving a decoded path history of predetermined previous state nodes and selectively using either one of the decoded path histories or a state specific value in response to the comparator circuit to provide a current path history for the state corresponding to the circuit unit, said path history means being implemented serially by one bit-wide digital circuitry.

5. An array of circuit units which each perform an add/compare/select (ACS) operation, said array implementing a predetermined code trellis diagram in accordance with a predetermined convolutional code, said array comprising:

a first ACS circuit having a first input, a second input and an output, said first ACS circuit calculating an accumulated metric for a first predetermined state;

a second ACS circuit having a first input coupled to both the second input and the output of the first ACS circuit via a first single bit-wide conductor, a second input coupled to the first input of the first ACS circuit via a second single bit-wide conductor, and an output;

a third ACS circuit having a first input coupled to the output of the second ACS circuit via a third single bit-wide conductor, a second input, and an output coupled to the second input of the second ACS circuit via the second single bit-wide conductor; and a fourth ACS circuit having a first input coupled to both an output thereof and to the second input of the third ACS circuit via a fourth single bit-wide conductor, and a second input coupled to the output of the second ACS circuit via the third single bit-wide conductor, said first, second, third and fourth ACS circuits each being implemented by one bit-wide digital circuitry to minimize circuit area and comprising:

first and second single bit-wide adder circuits for respectively providing first and second sums of predetermined state and branch metrics;

a single bit-wide comparator circuit coupled to the first and second adder circuits for comparing the first and second sums of predetermined state and branch metrics to determine which sum is a state metric with a lowest metric value;

storage means coupled to the first and second bit-wide adder circuits for storing each of the first and second sums; and a selector coupled to the storage means and comparator circuit for outputting one of the stored first and second sums as the predetermined state metric in response to the comparator circuit.

* * * * *